United States Patent [19]
Jackson

[11] Patent Number: 5,835,196
[45] Date of Patent: Nov. 10, 1998

[54] SYSTEM AND METHOD FOR ALIGNMENT OF INTEGRATED CIRCUITS MULTIPLE LAYERS

[75] Inventor: Ricky A. Jackson, Garland, Tex.

[73] Assignee: Texas Instruments Incorporated, Dallas, Tex.

[21] Appl. No.: 368,584

[22] Filed: Jan. 5, 1995

Related U.S. Application Data

[62] Division of Ser. No. 238,194, May 4, 1994, Pat. No. 5,403,754, which is a continuation of Ser. No. 954,515, Sep. 30, 1992.

[51] Int. Cl.⁶ .............................. G01B 11/00; G03B 27/00
[52] U.S. Cl. ................................. 355/53; 355/53; 355/54; 355/72; 356/399; 356/400; 356/401; 356/358; 356/359; 356/363
[58] Field of Search ...................... 356/401, 399, 356/400, 359, 358, 363; 355/72, 53, 54; 250/559.3

[56] References Cited

U.S. PATENT DOCUMENTS

| 5,005,046 | 4/1991 | Hashimoto | 355/77 |
| 5,333,050 | 7/1994 | Nose et al. | 356/356 |
| 5,438,413 | 8/1995 | Mazor | 356/363 |
| 5,444,538 | 8/1995 | Pellegrini | 356/401 |

*Primary Examiner*—R. L. Moses
*Assistant Examiner*—Shival P. Virmani
*Attorney, Agent, or Firm*—Robby T. Holland; Leo N. Heiting; Richard L. Donaldson

[57] ABSTRACT

An alignment system (30) is provided for use during the lithography process of producing multiple layer (24–26) integrated circuits. The location of each previous layer (24–26) in the integrated circuit is measured and evaluated with respect to each other and the wafer (14). The next layer is placed on the wafer (14) in a manner which optimizes its alignment relationship to each of the previous layers (24–26). Weighting factors are used to optimize alignment in multiple layer (24–26) integrated circuits.

6 Claims, 2 Drawing Sheets

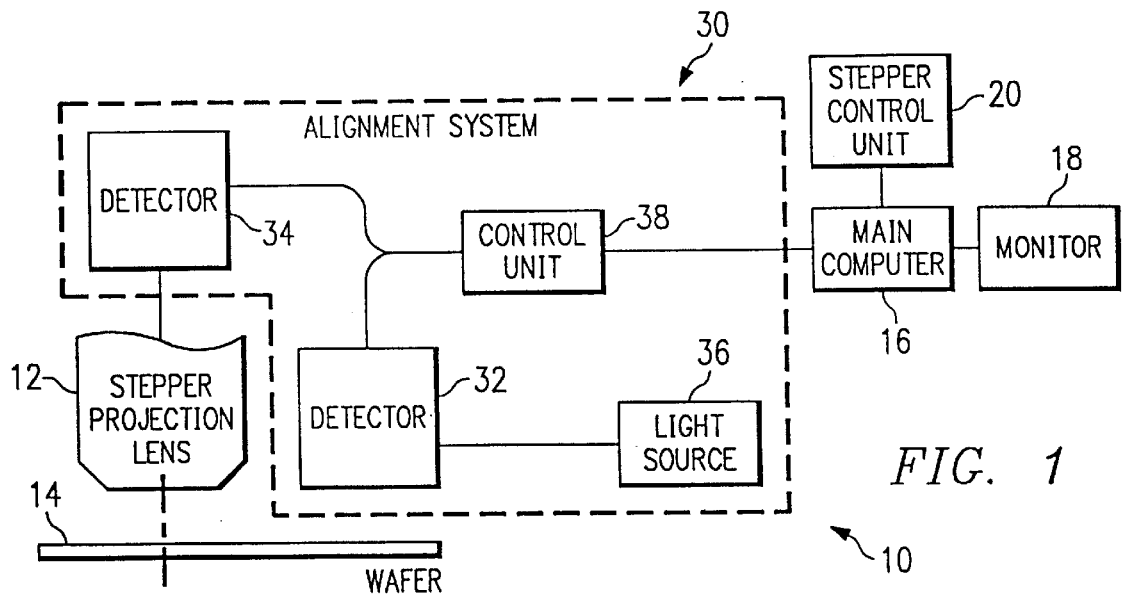
FIG. 1
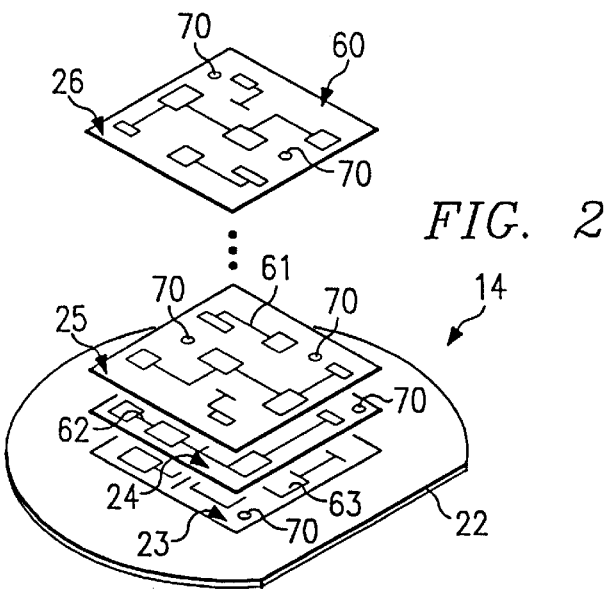
FIG. 2
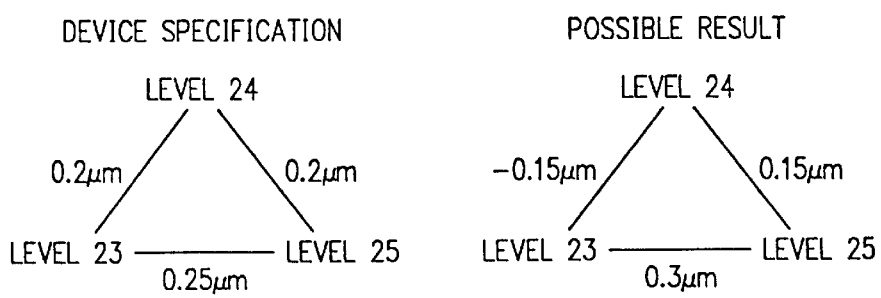
FIG. 3a
FIG. 3b

SYSTEM AND METHOD FOR ALIGNMENT OF INTEGRATED CIRCUITS MULTIPLE LAYERS

This is a division of application Ser. No. 08/238,194, filed May 4, 1994, WHICH IS A CONTINUATION OF Ser. No. 07/954,515, filed on Sep. 30, 1992.

RELATED APPLICATION

This application is related to co-pending U.S. patent application Ser. No. 07,954,516 filed on Sep. 30, 1992.

TECHNICAL FIELD OF THE INVENTION

This invention relates to integrated circuits, and more particularly relates to alignment of multiple layers of an integrated circuit during the lithography process.

BACKGROUND OF THE INVENTION

Various techniques have previously been used to align integrated circuits during the lithography process. A common technique used to fabricate an integrated circuit on a semiconductor device is to build the integrated circuit in layers on a silicon wafer substrate. Each layer corresponds to a process level during fabrication. The circuit design or pattern for each new layer must be placed upon the previous layer within a given spacial tolerance in order for the finished integrated circuit on the semiconductor device to perform its intended function.

Alignment is the term used to describe the placement of one layer of a multiple layered integrated circuit with respect to the other layers of the integrated circuit. One common alignment technique performed during the step and repeat lithography process of building a multiple layered integrated circuit is to use a laser or other light source to scan and detect a mark or illuminate a mark in a previous layer on the wafer. The mark is a typography feature created during the previous step in the lithography process. Alignment of the new layer to a previous layer may be performed by projecting a light source through the projection lens of a step-and-repeat camera or with an off axis light source and detector system.

A detector in the alignment system provides a signal which indicates the location of the previous circuit layer based on the location of the mark. Step and repeat lithography camera systems (frequently referred to as "steppers") use the detector as a ruler or measuring device for correlation of the alignment mark with the location of a previous circuit layer during fabrication of an integrated circuit on a wafer. An alignment check is performed at several locations for the previous layer on the wafer. The data is then used to generate the best grid or stepping pattern for the stepper to use in laying the next circuit layer on the previous circuit layer. The results of the overall alignment of the circuit layers are evaluated after the wafer has been fully exposed and developed.

Prior alignment techniques have worked well in the past for many integrated circuit designs. With the advent of more complex and smaller scale integrated circuits, it has become important to obtain alignment throughout the multiple layers of an integrated circuit on the wafer. Alignment of one layer in the circuit to a previous layer of the circuit must be held to a tight tolerance specification. Alignment of a third layer to the first and second layers must also be held within a tight tolerance. In the current state-of-the-art alignment process, each additional circuit layer is only aligned to marks generated at the previous circuit layer. Therefore, in a multiple layer integrated circuit having up to twenty layers, it is quite possible for alignment between the first and the twentieth layer to be greatly out of tolerance even though each of the individual layers between the first and the twentieth layer is within tolerance. This misalignment frequently results in a failure of the finished product and may substantially reduce the yield of the overall manufacturing process.

A need has thus risen for an alignment system which can be used during the fabrication of a multiple layer integrated circuit to provide alignment between multiple layers of the circuit.

SUMMARY OF THE INVENTION

In accordance with the present invention, disadvantages and problems associated with previous alignment systems used during fabrication of multiple layer integrated circuits on semiconductor wafers have been substantially reduced or eliminated. Each new layer of an integrated circuit may be aligned with respect to the previous circuit layer and with other layers on the wafer. Each layer of the final integrated circuit will thus be within the required tolerance relationship with the other layers of the circuit.

In accordance with one aspect of the invention, a weighting factor is used when evaluating the spacial relationship between multiple layers of the integrated circuit. The geometric position of typography marks on each layer is compared and based upon the design tolerance for each layer and the importance of matching the tolerances between multiple layers, a weighting factor is assigned for positioning the next layer in the circuit to optimize its relationship with previous circuit layers.

In accordance with another aspect of the invention, measurement of alignment offsets from marks generated at more than one previous process level or layer and based on data calculated from these reference locations, the optimum alignment offset is determined for the next process level which will be placed on the wafer during the lithography process. This invention results in improved functioning of the stepper lithography process to place complex multiple layer integrated circuits on semiconductor wafers.

An important technical feature of the invention is using multiple layer alignments which reduce the requirement to prepare alignment test wafers and increases the productivity of the integrated circuit fabrication process.

Another important technical feature of the present invention is placement of all layers of a multiple layer integrated circuit within designed spacial tolerances.

BRIEF DESCRIPTION OF THE DRAWINGS

For a more complete understanding of the present invention and the advantages thereof, reference is now made to the following descriptions taken in conjunction with accompanying drawings, in which:

FIG. 1 is a schematic drawing showing portions of a step and repeat lithography camera system (stepper) and alignment system for use with the present invention;

FIG. 2 is a schematic representation, in section and elevation with portions broken away, of a semiconductor substrate and layers of an integrated circuit which are formed on the substrate by the stepper of FIG. 1;

FIGS. 3a and 3b is a schematic representation of alignment errors which may occur between layers of the integrated circuit of FIG. 2.

DETAILED DESCRIPTION OF THE INVENTION

Figure 4:
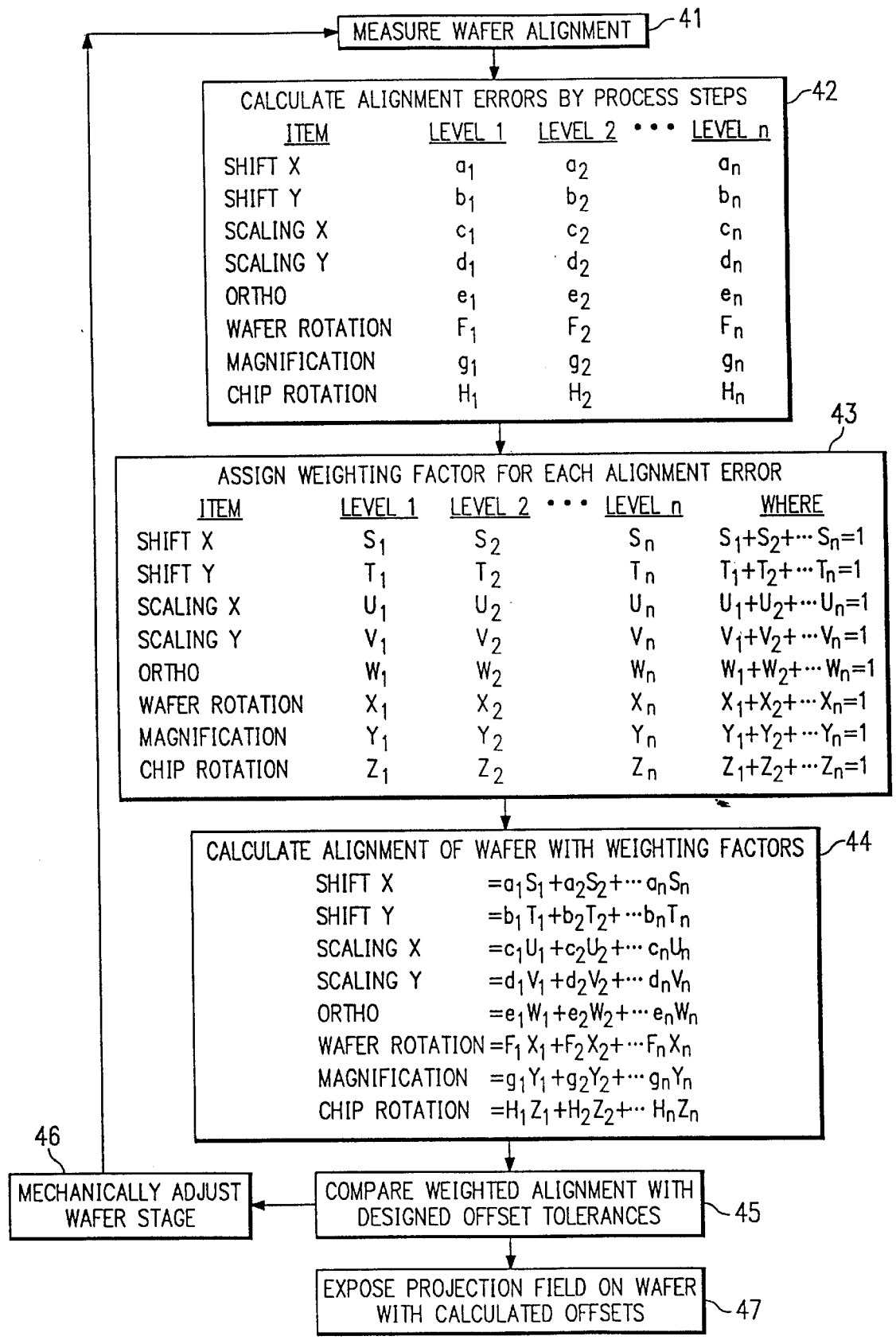
FIG. 4 is a block diagram of the present invention used with the stepper of FIG. 1 to avoid the alignment errors shown in FIG. 3.

The preferred embodiment of the present invention and its advantages are best understood by referring to FIGS. 1 through 4 of the drawings, like numerals being used for like and corresponding parts of the various drawings.

Various elements and components of step and repeat lithography camera system 10 (herein referred to stepper 10) are shown in FIG. 1. Various step and repeat camera systems are commercially available for use with the present system. One source of step and repeat camera systems is Nikon Precision, Inc., located in Belmont, Calif., a subsidiary of Nikon Corporation.

Projection lens 12 of stepper 10 is used to project integrated circuit 60 or portions 61, 62 and 63 of integrated circuit onto selected exposure fields on wafer 14. Other components of stepper 10 shown in FIG. 1 are main computer 16, monitor 18, stepper control unit 20 and alignment system 30. Wafer 14 is a relatively thin slice of semiconductor material such as silicon. Wafer 14 is normally secured to a wafer holder or stage (not shown) which can be moved to position wafer 14 relative to projection lens 12. Stepper 10 includes a plurality of servocontrol motors (not shown) and related gears (not shown) which aid in positioning wafer 14 relative to projection lens 12. Stepper 10 can typically move wafer 14 relative to projection lens 12 in the X and Y axis, rotate wafer 14, and tilt wafer 14.

As best shown in FIG. 2, wafer 14 includes substrate 22. Stepper 10, using photolithography processes, can fabricate a series of layers 23, 24, 25, etc., of an integrated circuit on substrate 22. Layers 23 through 26 are formed on the surface of substrate 22 through the use of selected photoresist and doping compounds. Layer 26 may represent twenty or more layers. As integrated circuits have become more complex, more and more layers of an integrated circuit must be formed on substrate 22. Each layer 23–26 corresponds to a process level or process step in fabrication of the complete integrated circuit. As the number of layers in an integrated circuit increases, requirements for alignment with respect to adjacent layers also becomes more critical.

As shown in FIGS. 3a and 3b, the design tolerance specification for a selected dimension or alignment variable between levels 23 and 24 may be 0.2 micrometers; between levels 24 and 25, 0.2 micrometers; and between levels 23 and 25, 0.25 micrometers. Prior alignment systems which measure alignment only between adjacent layers, could result in the alignment between level 23 and level 24 being a negative 0.15 micrometers, and the alignment between levels 24 and 25, 0.15 micrometers. Both of these alignments would be within tolerance for the design specification. However, the alignment between levels 23 and 25, would be out of specification at 0.3 micrometers. This misalignment frequently results in stepper systems that only measure the alignment between a single previous layer which has been placed on the semiconductor wafer and the next layer which will be projected onto the semiconductor wafer by stepper 10. Therefore, current semiconductor fabrication facilities require extensive alignment testing of semiconductor devices after the complete integrated circuit has been fabricated with multiple layers. This after-the-fact testing frequently results in reducing the yield from the integrated circuit fabrication facility.

Alignment system 30 of the present invention may include either offset detector 32 or inline detector 34. Detector 32 projects light from source 36 onto wafer 14 and indicates the position of typography marks 70 in layers 23, 24, 25, etc. formed on wafer 14. Inline detector 34 transmits light from source 36 through projection lens 12 and indicates the position of the topography marks on wafer 14. The present invention can be used with an alignment system having either offset detector 32 or an inline detector 34. Control unit 38 notes the location of marks associated with each circuit layer on wafer 14 and provides this information to main computer 16 of stepper 10. This information is stored within computer 16 and analyzed in accordance with the flow chart shown in FIG. 4.

The first step (block 41) in the alignment process is to measure and record the position of wafer 14 and layers 23–26, which have previously been formed on wafer 14, relative to projection lens 12. The second step (block 42) in the alignment process is to calculate the alignment error between the various typography marks 70 for layers 23–26 which are being analyzed. The dimensions or alignment variables which are typically evaluated for alignment errors through the use of marks 70 in the various circuit layers 23–26 include shift in the X and Y axis, scaling in the X and Y axis, orthogonality relative to projection lens 12, and rotation of wafer 14. Alignment is also measured with respect to magnification for the specific exposure field and chip rotation of the specific exposure field. This information is retained for each level 23 through level 26 of the integrated circuit being fabricated.

The next step (block 43) in the alignment process is to assign a weighting factor for each alignment variable as shown in block 43. For example, for a shift in the X axis, a weighting factor S1 through Sn is assigned for each level 1 through level n. The total of each weighting factor for shift in the X axis S1 plus S2 plus Sn must equal 1. In the same manner, weighting factors are calculated for the other alignment variables such as shift in the Y axis, scaling in the X and Y axis, etc.

The next step (block 44) in the alignment process is to calculate the optimum position for wafer 14 using the weighting factors to obtain the best fit for placing the next circuit layer onto wafer 14. As represented by blocks 45 and 46, if the alignment for the next layer is not within design specifications, wafer 14 is mechanically adjusted relative to projection lens 12. If alignment for the next layer as determined in block 45 is satisfactory with respect to all of the layers previously placed on wafer 14, exposure for the next layer is completed (block 47) through projection lens 12.

The result of this process is fabrication of a multiple layer integrated circuit which does not require extensive alignment testing of completed semiconductor devices.

The previous written description has described the invention with respect to optical lithography using ultraviolet light. Those skilled in the art will readily appreciate that the present invention may be used with other lithographic technologies such as x-ray or electron beam lithography. The invention has also been described with respect to projection lithography techniques. Those skilled in the art will readily note that the improved alignment system disclosed by this invention may also be used in proximity lithography. Both proximity and projection lithography systems will benefit from incorporating the improved alignment techniques resulting from this invention.

Although the present invention has been described in detail, it should be understood that various changes, substitutions and alterations can be made without departing from the spirit and scope of the invention as defined by the following claims.

What is claimed is:

1. A system for aligning multiple layers of an integrated circuit during the fabrication of the integrated circuit on a semiconductor wafer using photolithography techniques, comprising:

an alignment system to detect and record the location of each layer of the integrated circuit on the semiconductor wafer;

a computer for recording the location of each layer of the integrated circuit relative to other layers of integrated circuit in the wafer; and means for calculating the optimum location of a new layer on the wafer to directly align the new layer with respect to the existing layers.

2. The system for aligning multiple layers of an integrated circuit as defined in claim 1, wherein the means for calculating the optimum location further comprises:

a plurality of typography marks placed in each layer of the integrated circuit; and a light source and detector in the alignment system to indicate the location of each topography mark.

3. The system for aligning multiple layers of an integrated circuit as defined in claim 2 wherein the means for calculating the optimum location further comprises:

the computer with selected alignment variables associated the location of each layer on the wafer; and weighting factors assigned to the selected alignment variables within the computer.

4. The system for aligning multiple layers of an integrated circuit as defined in claim 1, further comprising a step and repeat camera system to project selected portions of the integrated circuit onto the semiconductor wafer.

5. The system for aligning multiple layers of an integrated circuit as defined in claim 3, further comprising a light source and detector in the alignment system offset from the axis of the lens in the step and repeat camera system.

6. The system for aligning multiple layers of an integrated circuit as defined in claim 4, further comprising a light source and detector in line with the lens of the step and repeat camera system.

* * * * *